United States Patent
Sen et al.

(10) Patent No.: US 8,361,870 B2
(45) Date of Patent: Jan. 29, 2013

(54) SELF-ALIGNED SILICIDATION FOR REPLACEMENT GATE PROCESS

(75) Inventors: Indradeep Sen, Austin, TX (US); Thorsten Kammler, Ottendorf-Okrilla (DE); Andreas Knorr, Wappingers Falls, NY (US); Akif Sultan, Austin, TX (US)

(73) Assignee: Globalfoundries Inc., Grand Cayman (KY)

( * ) Notice: Subject to any disclaimer, the term of this patent is extended or adjusted under 35 U.S.C. 154(b) by 191 days.

(21) Appl. No.: 12/843,350

(22) Filed: Jul. 26, 2010

(65) Prior Publication Data
US 2012/0018816 A1 Jan. 26, 2012

(51) Int. Cl.
*H01L 21/336* (2006.01)
(52) U.S. Cl. .. 438/299; 257/410; 257/255; 257/E21.409
(58) Field of Classification Search ............. 257/410, 257/E21.409, E29.255; 438/299
See application file for complete search history.

(56) References Cited

U.S. PATENT DOCUMENTS
2008/0185637 A1* 8/2008 Nagaoka et al. .............. 257/327
* cited by examiner

*Primary Examiner* — Eugene Lee
*Assistant Examiner* — Elias M Ullah
(74) *Attorney, Agent, or Firm* — Ditthavong Mori & Steiner, P.C.

(57) ABSTRACT

A semiconductor device is formed with low resistivity self aligned silicide contacts with high-K/metal gates. Embodiments include postponing silicidation of a metal layer on source/drain regions in a silicon substrate until deposition of a high-K dielectric, thereby preserving the physical and morphological properties of the silicide film and improving device performance. An embodiment includes forming a replaceable gate electrode on a silicon-containing substrate, forming source/drain regions, forming a metal layer on the source/drain regions, forming an ILD over the metal layer on the substrate, removing the replaceable gate electrode, thereby forming a cavity, depositing a high-K dielectric layer in the cavity at a temperature sufficient to initiate a silicidation reaction between the metal layer and underlying silicon, and forming a metal gate electrode on the high-K dielectric layer.

15 Claims, 3 Drawing Sheets

SELF-ALIGNED SILICIDATION FOR REPLACEMENT GATE PROCESS

TECHNICAL FIELD

The present disclosure relates the fabrication of semiconductor devices using a replacement gate process. The present disclosure is particularly applicable to semiconductor devices in 32 nanometer (nm) technology nodes and beyond.

BACKGROUND

In conventional gate first CMOS integration flow, a self aligned silicide process is used to form low resistivity contacts on the source/drain and gate electrodes after the gate stack is formed. This is typically implemented by reacting a metal, such as nickel (Ni), e.g., a nickel (Ni)/platinum (Pt) alloy with silicon (Si) on an exposed surface containing Si.

Metal gate electrodes have evolved for improving CMOS drive current by reducing polysilicon depletion that occurs with polysilicon gate electrodes. However, simply replacing polysilicon gate electrodes with metal gate electrodes engenders issues in forming the metal gate electrode prior to high temperature annealing to activate the source/drain implants, as at a temperature in excess of 900° C. Such elevated temperatures tend to degrade the metal gate electrode or cause interaction with the gate dielectric, thereby adversely impacting transistor performance. Gate last high-K metal gate, also called replacement gate, techniques have been developed to address problems attendant upon substituting metal gate electrodes for polysilicon gate electrodes. For example, an amorphous silicon (a-Si) or polysilicon gate is used during initial processing until high temperature annealing to activate source/drain implants has been implemented. Subsequently, the a-Si or polysilicon is removed and replaced with a metal gate.

The migration to gate last high-K/metal gate integration has engendered problems with the thermal stability and resistivity of Ni/Pt silicide films due to the high temperature thermal cycles to which they are subjected during deposition of the high-K dielectric and replacement gate metal fill. The exposure to high temperatures post silicidation causes physical and morphological changes in the silicide film, thereby degrading electrical properties. Consequently, MOSFET device performance is adversely impacted due to poor series resistance and channel strain degradation.

A need therefore exists for methodology enabling the formation of low resistivity self aligned silicide contacts with a replacement gate process, and the resulting devices.

SUMMARY

An aspect of the present disclosure is an improved method of fabricating a high-K/metal gate semiconductor device by forming self aligned silicide contacts during high-K dielectric deposition.

Another aspect of the present disclosure is a high-K/metal gate semiconductor device with low resistivity self aligned silicide contacts formed during high-K dielectric deposition.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method comprising: forming a replaceable gate electrode, such as polysilicon, on a silicon-containing substrate; forming source/drain regions in the substrate adjacent opposite sides of the replaceable gate electrode; forming a metal layer on the source/drain regions and the gate electrode; forming a sacrificial inter layer dielectric (ILD), such as silicon dioxide, over the metal layer on the substrate; removing the replaceable gate electrode, thereby forming a cavity; depositing a high-K dielectric layer in the cavity at a temperature sufficient to initiate a silicide reaction between the metal layer and underlying silicon; and forming a metal gate electrode on the high-K dielectric layer.

Aspects of the present disclosure include forming a layer of Ni/Pt alloy as the metal layer. Another aspect includes depositing the high-K dielectric at a temperature of 300° C. to 550° C., for example a temperature sufficient to form low resistivity nickel silicide (NiSi). Other aspects include forming the metal gate electrode at a temperature sufficient to provide a high temperature anneal cycle to form a stable NiSi film, such as at a temperature of 320° C. to 550° C. Additional aspects include forming dielectric sidewall spacers on the gate electrode prior to forming the source/drain regions, and forming the cavity between the sidewall spacers. Another aspect includes epitaxially forming silicon germanium (SiGe) and/or silicon carbon (SiC) source/drain regions. Further aspects include conformally depositing the Ni/Pt layer on the source/drain regions and the replaceable gate electrode. Other aspects include polishing the sacrificial ILD down to the top of the replaceable gate electrode after forming the ILD. Additional aspects include polishing the metal gate electrode. Another aspect includes removing the sacrificial ILD to expose the silicide after polishing the metal gate electrode. Further aspects include removing remaining unreacted Ni/Pt after removing the sacrificial ILD. Additional aspects include depositing a second ILD over the entire substrate after removing the unreacted Ni/Pt.

Another aspect of the present disclosure is a semiconductor device comprising: a high-K dielectric layer on a substrate between gate sidewall spacers; a metal gate electrode on the high-K dielectric layer; source/drain regions in the substrate adjacent opposite sides of the gate electrode; a self-aligned nickel (Ni) silicide on the source/drain regions, the Ni silicide being formed during deposition of the high-K dielectric layer and formation of the metal gate electrode, and having a resistivity less than 20μ-ohm-cm.

Aspects include a semiconductor device including the high-K dielectric comprising hafnium oxide. Further aspects include the metal gate electrode comprising tungsten. Other aspects include the Ni silicide substantially comprising NiSi.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompa- FIGS. 1A-1I schematically illustrate sequential steps of a method in accordance with an exemplary embodiment.

DETAILED DESCRIPTION

Figure 1A:
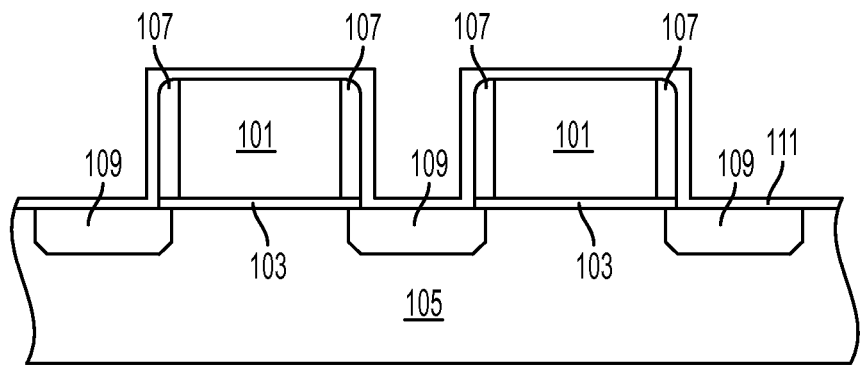

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

In an attempt to maximize the thermal stability and minimize the resistivity of Ni/Pt silicide contacts with a replacement gate process, an extra mask was implemented to form the silicide subsequent to ILD deposition and gate metal replacement. By forming the silicide after the metal gate formation, the silicide was not subjected to the high temperatures required for depositing the high-K dielectric and the replacement gate metal fill. However, with the use of a mask, the silicide width was reduced, which degraded MOSFET series resistance. Further, the use of the mask increased variation and device asymmetry, while adding to the cost of the process. An attempt was also made to deposit the high-K dielectric early and perform the metal gate replacement after forming self aligned silicide contacts. The formation of the silicide after the high-K dielectric avoided subjecting the silicide to elevated temperatures. However, the gate stack etch became more complicated with the high-K dielectric already in place, and the high-K dielectric was disadvantageously exposed to plasma treatment, during polysilicon gate removal. Charged traps were introduced in the high-K dielectric film thereby having a negative impact on device reliability. Further, boron diffused into the high-K dielectric causing Vt shift and device degradation.

The present disclosure addresses and solves the thermal stability issues attendant upon forming silicide contacts in a replacement gate process. In accordance with embodiments of the present disclosure, a Ni/Pt layer is formed on the source/drain regions prior to depositing the high-K dielectric, but silicidation reaction is implemented during the high-K dielectric deposition. In this embodiment, the silicide is self aligned, without the addition of an extra mask, and the silicide is not exposed to the high temperatures employed during high-K dielectric deposition and gate metal fill.

Methodology in accordance with embodiments of the present disclosure includes forming a replaceable gate electrode on a silicon-containing substrate, forming source/drain regions in the substrate adjacent opposite sides of the replaceable gate electrode, forming a metal layer on the source/drain regions and the gate electrode, forming an ILD over the metal layer on the substrate, removing the replaceable gate electrode, thereby forming a cavity, depositing a high-K dielectric layer in the cavity at a temperature sufficient to initiate a silicidation reaction between the metal layer and underlying silicon, and forming a metal gate electrode on the high-K dielectric layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

A process of fabricating a semiconductor device in accordance with an embodiment of the present disclosure is illustrated in FIGS. 1A-1I. Adverting to FIG. 1A, polysilicon gates 101 may each be formed on a dielectric layer 103 on a silicon substrate 105. Gate sidewall spacers 107, for example of a nitride material, e.g., silicon nitride, may be formed on opposite sides of each polysilicon gate 101. Source/drain regions 109 may be formed by conventional processes, such as epitaxially, for example of SiGe and/or SiC, in substrate 105 at opposite sides of each gate 101 and appropriately doped. Subsequently, a metal layer 111, for example a Ni/Pt alloy containing 2 atomic % to 4 atomic % Pt, may be sputter deposited on the entire wafer to a thickness of 8 nm to 12 nm.

Figure 1B:
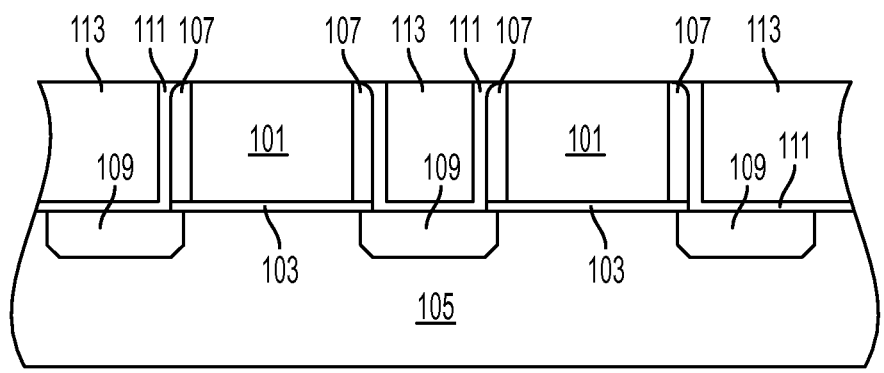
Figure 1C:
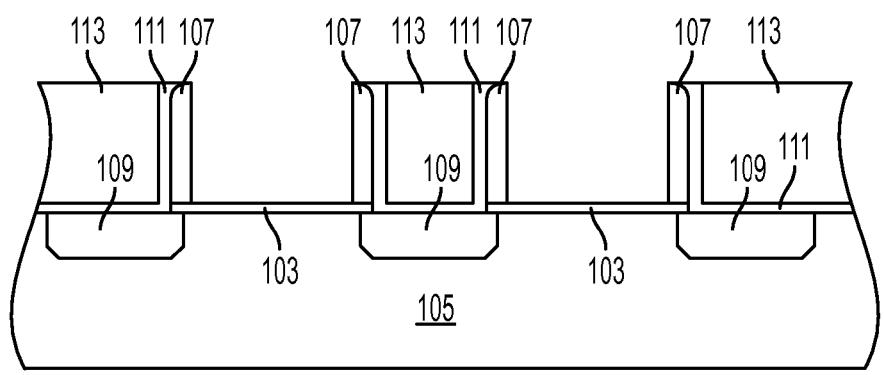

As illustrated in FIG. 1B, an ILD 113, such as silicon dioxide, may then be deposited over the entire wafer and polished down to the top of polysilicon gates 101. Metal layer 111 over polysilicon gates 101 is removed, as by polishing, e.g., chemical mechanical polishing, thereby exposing the polysilicon gates. The polysilicon gates 101 may then be removed, as in a conventional manner by etching, as shown in FIG. 1C, thereby forming a cavity between spacers 107 for each gate.

Figure 1D:
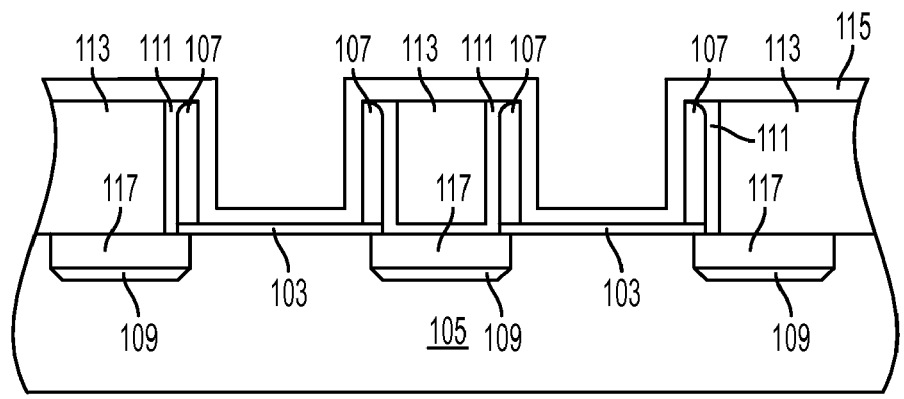

Adverting to FIG. 1D, a high-K dielectric layer 115, for example of hafnium oxide, may then be conformally deposited over the entire wafer to a thickness of 1.5 nm to 2.5 nm. High-K dielectric layer 115 may be deposited by atomic layer deposition (ALD) at a temperature of 300° C. to 350° C. or by metal organic chemical vapor deposition (MOCVD) at a temperature of 450° C. to 550° C., for an appropriate length of time to achieve the target thickness. The deposition temperature and time may be optimized to initiate a silicidation reaction between metal layer 111 and the underlying silicon of source/drain regions 109 to form metal silicide 117, e.g., NiSi.

Figure 1E:
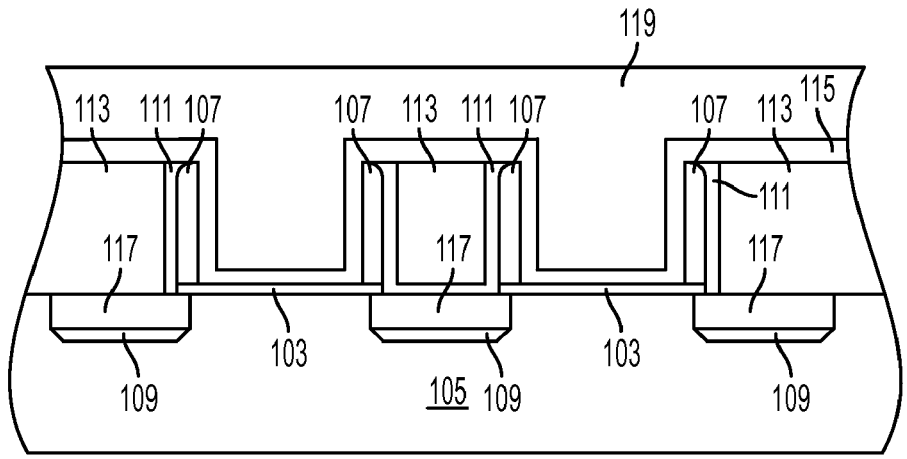

As illustrated in FIG. 1E, gate metal 119, e.g., tungsten, may be deposited at a temperature of 320° C. to 550° C., for example 350° C. to 450° C. The deposition time and temperature may be selected in order to provide a high temperature anneal cycle to form a stable film of NiSi 117.

Figure 1F:
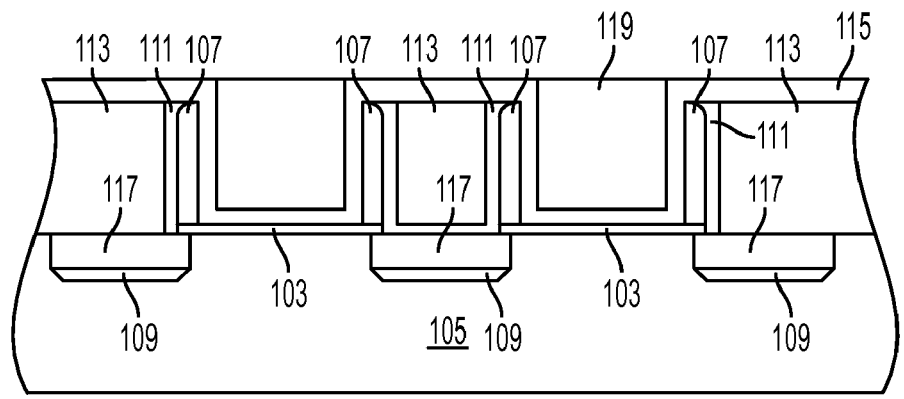
Figure 1G:
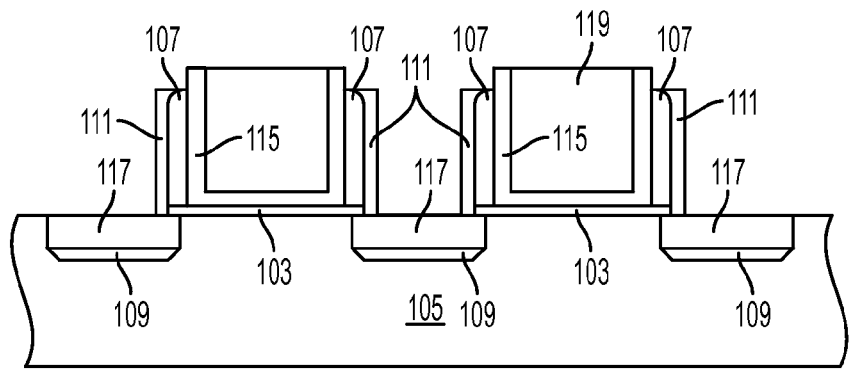

Deposited gate metal 119 is then polished, as illustrated in FIG. 1F. Subsequently, high-K dielectric layer 115 and ILD 113 may be removed, as by etching, to expose metal silicide 117 (see FIG. 1G).

Figure 1H:
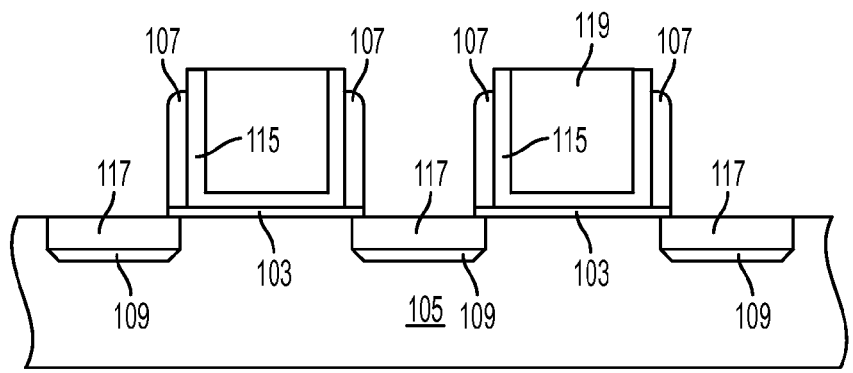

Adverting to FIG. 1H, the remaining unreacted portion of metal layer 111, on the silicon substrate and on the gate sidewall spacers 107 may be removed, as by using inorganic solvents. Conventional solvents such as dilute sulfuric acid, or aqua regia may be employed.

Figure 1I:
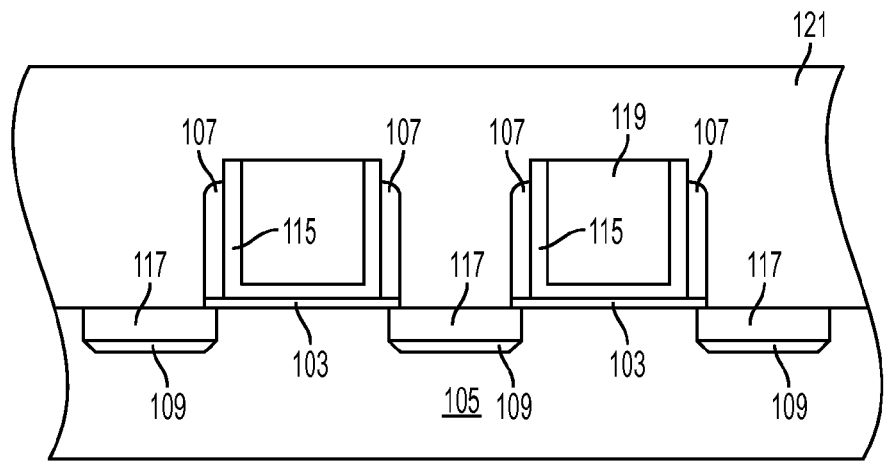

As illustrated in FIG. 1I, a second ILD 121 is deposited over the entire wafer and polished. The device is then ready for contact formation and further conventional processing.

The embodiments of the present disclosure can achieve several technical effects, including reduced resistivity self aligned silicide contacts with high-K/metal gates and lesser variation in contact resistance and device performance due to self aligned nature of the silicide formation. The present disclosure enjoys industrial applicability in any of various types of highly integrated semiconductor devices such as SRAMs, logic devices, and IO devices, particularly 32 nanometer (nm) node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method of fabricating a semiconductor device, the method comprising:
    forming a replaceable gate electrode on a silicon-containing substrate;
    forming source/drain regions in the substrate adjacent opposite sides of the replaceable gate electrode;
    forming a metal layer on the source/drain regions and the replaceable gate electrode;
    forming an inter layer dielectric (ILD) over the metal layer on the source/drain regions;
    removing the replaceable gate electrode, thereby forming a cavity;
    depositing a high-K dielectric layer in the cavity at a temperature sufficient to initiate a silicide reaction between the metal layer and silicon of the silicon-containing substrate underlying the metal layer and concurrently initiating the silicide reaction; and
    forming a metal gate electrode on the high-K dielectric layer.

2. The method according to claim 1, comprising forming a layer of nickel (Ni) and platinum (Pt) alloy as the metal layer.

3. The method according to claim 2, comprising depositing the high-K dielectric at a temperature of 300° C. to 550° C.

4. The method according to claim 3, comprising depositing the high-K dielectric at a temperature sufficient to form NiSi.

5. The method according to claim 4, comprising forming the metal gate electrode at a temperature sufficient to effect a high temperature anneal cycle to form a stable NiSi film.

6. The method according to claim 5, comprising forming the metal gate electrode at a temperature of 320° C. to 550° C.

7. The method according to claim 1, comprising:
    forming dielectric sidewall spacers on the gate electrode prior to forming the source/drain regions; and
    forming the cavity between the sidewall spacers.

8. The method according to claim 1, comprising epitaxially forming silicon germanium (SiGe) and/or silicon carbon (SiC) source/drain regions.

9. The method according to claim 1, comprising conformally depositing a Ni and Pt alloy layer on the source/drain regions and the replaceable gate electrode as the metal layer.

10. The method according to claim 9, further comprising polishing the metal gate electrode.

11. The method according to claim 10, wherein the silicide reaction forms a silicide with a portion of the Ni and Pt, the method further comprising removing the ILD to expose the silicide after polishing the metal gate electrode.

12. The method according to claim 1, further comprising polishing the ILD down to the top of the replaceable gate electrode after forming the ILD.

13. The method according to claim 11, further comprising removing remaining Ni and Pt, which has not reacted with underlying silicon, after removing the ILD.

14. The method according to claim 13, further comprising depositing a second ILD over the entire substrate after removing the unreacted Ni and Pt.

15. A method of fabricating a semiconductor device, the method comprising:
    forming a polysilicon gate electrode on a substrate;
    forming sidewall spacers on the gate electrode;
    epitaxially forming silicon germanium (SiGe) and/or silicon carbon (SiC) source/drain regions in the substrate adjacent opposite sides of the gate electrode;
    depositing a nickel (Ni) and platinum (Pt) layer on the source/drain regions and the gate electrode;
    forming an inter layer dielectric (ILD) on the source/drain regions;
    polishing the ILD down to the top of the polysilicon gate electrode;
    removing the polysilicon gate electrode, thereby forming a cavity between the sidewall spacers;
    depositing a high-K dielectric layer at a temperature of 300° C. to 550° C. in the cavity, thereby initiating a silicide reaction between a portion of the Ni and Pt of the Ni and Pt layer and the underlying source/drain regions, forming a silicide on the source/drain regions;
    forming a metal gate electrode at a temperature of 320° C. to 550° C. on the high-K dielectric layer;
    removing the ILD to expose the silicide; and
    removing remaining Ni and Pt of the Ni and Pt layer which has not reacted with the underlying source/drain regions.

* * * * *